(12) United States Patent
Chen

(10) Patent No.: US 7,608,473 B2
(45) Date of Patent: Oct. 27, 2009

(54) IMAGE SENSOR DEVICE AND MANUFACTURING METHOD THEREOF

(75) Inventor: Anchor Chen, Pingtung (TW)

(73) Assignee: United Microelectronics Corp., Hsinchu (TW)

( * ) Notice: Subject to any disclaimer, the term of this patent is extended or adjusted under 35 U.S.C. 154(b) by 310 days.

(21) Appl. No.: 11/099,058

(22) Filed: Apr. 5, 2005

(65) Prior Publication Data

US 2005/0250242 A1 Nov. 10, 2005

Related U.S. Application Data

(62) Division of application No. 10/839,524, filed on May 4, 2004, now Pat. No. 7,235,833.

(51) Int. Cl.
*H01L 21/00* (2006.01)

(52) U.S. Cl. .................. 438/57; 257/291; 257/292; 257/293; 257/E27.131; 257/E27.132; 257/E27.133

(58) Field of Classification Search .................. 257/72, 257/91–93; 438/57
See application file for complete search history.

(56) References Cited

U.S. PATENT DOCUMENTS 6,838,715 B1 * 1/2005 Bencuya et al. ............. 257/291

2002/0024001 A1 * 2/2002 Hiyama et al. ............. 250/208.1
2004/0251395 A1 * 12/2004 Takahashi et al. ........ 250/208.1
2005/0040317 A1 * 2/2005 Yaung ..................... 250/208.1
2006/0014314 A1 * 1/2006 Yaung et al. ................. 438/69
2006/0081898 A1 * 4/2006 Wang et al. ................ 257/291

FOREIGN PATENT DOCUMENTS

KR 2005-20020 * 3/2009

* cited by examiner

*Primary Examiner*—A. Sefer
(74) *Attorney, Agent, or Firm*—J.C. Patents

(57) ABSTRACT

An image sensor and a manufacturing method thereof are provided. The image sensor includes a plurality of sensors, an inter-layer dielectric layer formed over the sensors, a first inter-metal dielectric layer formed over the inter-layer dielectric layer, and a plurality of first via walls formed in the first inter-metal dielectric layer, wherein each of the first via walls is formed around each of the sensors. In addition, the image sensor further includes a second inter-metal dielectric layer formed over the first inter-metal dielectric layer and a plurality of second via walls formed in the second inter-metal dielectric layer, wherein each of the second via walls is formed around each of the sensors. Therefore, the light leakage between different pixels and the problem of crosstalk are solved, and the spatial resolution and the photo sensitivity of the image sensor are enhanced.

13 Claims, 3 Drawing Sheets

IMAGE SENSOR DEVICE AND MANUFACTURING METHOD THEREOF

CROSS-REFERENCE TO RELATED APPLICATION

This application is a division of, and claims the priority benefit of, U.S. application Ser. No. 10/839,524 filed on May 4, 2004 now U.S. Pat. No. 7,235,833.

BACKGROUND OF THE INVENTION

1. Field of the Invention

The present invention is generally related to an image sensor and a manufacturing method thereof. More particularly, the present invention relates to an image sensor and a manufacturing method thereof for preventing light leakage between different pixels.

2. Description of Related Art

Conventionally, a charge coupled device (CCD) is generally used for a solid-state image sensor since the property of high dynamic range, low dark current, and well developed technology. A conventional CCD comprises a photodiode array, and pulsed voltage is applied to the charge stored by each photodiode, so as to output a corresponding electric signal. However, in recent years, complementary metal oxide semiconductor (CMOS) image sensor (CMOS Image Sensor, "CIS") is substantially developed for being compatible with the manufacturing process of a CMOS transistor. Thus, CMOS image sensor having a chip including a photodiode and an MOS transistor is used as solid imaging devices. A CMOS image sensor can be easily manufactured and the chip size thereof can be reduced. In addition, the CMOS image sensor can be easily integrated on a chip having other peripheral circuits, and thus the cost and the power consumption of an image sensor can be reduced. In summary, a CMOS image sensor is preferable to a CCD in a low cost image sensing application, and therefore application of the CMOS transistor in the CMOS image sensor is greatly enhanced.

In a solid-state image sensor device, such as a CMOS image sensor described above, the problem of light leakage between different pixels is an important issue that may influence the photo sensitivity of the image sensor device. FIG. 1 is a cross-sectional view schematically illustrating a conventional image sensor device. Referring to FIG. 1, a conventional CMOS image sensor 100 includes a plurality of sensors 102, an inter-layer dielectric (ILD) layer 104, inter-metal dielectric (IMD) layers 106 and 108 having a plurality of metal 1 (M1) layers 112 and metal 2 (M2) layers 114 respectively, and a cover layer 110. The sensor 102 includes a photo sensor. For a CMOS image sensor 100, in general, the sensors 102, the M1 and M2 layers 112 and 114 are arranged as an array.

Hereinafter, the light leakage problem will be discussed. FIG. 2 schematically illustrates the crosstalk of the image sensor device shown in FIG. 1. Referring to FIG. 2, for example, the sensor 102a is used to receive the light 202 of the image. However, the lights 204 or 206 being incident from the neighboring pixels may also be received by the sensor 102a. Therefore, the crosstalk between the pixels in the image sensor is generated and thus the spatial resolution of the image sensor is low. Therefore, the photo sensitivity of the image is low. Accordingly, an image sensor that can prevent light leakage between different pixels to solve the problem of crosstalk is quite indispensable.

SUMMARY OF THE INVENTION

Accordingly, the present invention is directed to an image sensor for preventing light leakage between different pixels to solve the problem of crosstalk. Thus, the spatial resolution and the photo sensitivity of the image sensor are enhanced.

In addition, the present invention is directed to a method of manufacturing an image sensor for preventing light leakage between different pixels to solve the problem of crosstalk. Thus, the spatial resolution and the photo sensitivity of the image sensor are enhanced.

The image sensor according to an embodiment of the invention comprises, for example but not limited to, a plurality of sensors, an inter-layer dielectric layer formed over the sensors, a first inter-metal dielectric layer formed over the inter-layer dielectric layer, and a plurality of first via walls formed in the first inter-metal dielectric layer, wherein each of the first via walls is disposed around each of the sensors.

In one embodiment of the invention, the image sensor further comprises a second inter-metal dielectric layer formed over the first inter-metal dielectric layer and a plurality of second via walls formed in the second inter-metal dielectric layer, wherein each of the second via walls is disposed around each of the sensors.

In one embodiment of the invention, the image sensor further comprises a cover layer formed over the inter-metal dielectric layer. In another embodiment of the invention, the cover layer comprises a plurality of color filters, wherein each of the color filter is formed over each of the sensors.

In one embodiment of the invention, the image sensor further comprises a plurality of micro lens formed over the cover layer, wherein each of the micro lenses is formed over the each of the sensors.

In one embodiment of the invention, the image sensor comprises a CMOS image sensor.

In one embodiment of the invention, the sensors comprise photo sensors.

In one embodiment of the invention, the material of the first via walls and/or a material of the second via walls comprise a non-transparent material.

In one embodiment of the invention, the material of the first via walls and/or a material of the second via walls comprise a reflective material. In another embodiment of the invention, the reflective material comprises metal such as aluminum or copper.

In addition, the invention provides a method of manufacturing an image sensor comprising, for example but not limited to, the following steps. First of all, a plurality of sensors is provided. Next, an inter-layer dielectric layer is formed over the sensors. Then, a first inter-metal dielectric layer is formed over the inter-layer dielectric layer. Then, a plurality of first via walls is formed in the first inter-metal dielectric layer, wherein each of the first via walls is disposed around each of the sensors.

In one embodiment of the invention, the method further comprises forming a plurality of first metal layers in the first inter-metal dielectric layer. In another embodiment of the invention, the first via walls and the first metal layers are formed simultaneously.

In one embodiment of the invention, the method further comprises forming a second inter-metal dielectric layer over the first inter-metal dielectric layer and forming a plurality of second via walls in the second inter-metal dielectric layer, wherein each of the second via walls is disposed around each of the sensors.

In one embodiment of the invention, the method further comprises forming a plurality of second metal layers in the second inter-metal dielectric layer. In another embodiment of the invention, the second via walls and the second metal layers are formed at the same time.

In one embodiment of the invention, the method further comprises forming a cover layer formed over the inter-metal dielectric layer. In another embodiment of the invention, the cover layer comprises a plurality of color filters, wherein each of the color filter is formed over each of the sensors.

In one embodiment of the invention, the method further comprises forming a plurality of micro lens over the cover layer, wherein each of the micro lenses is formed over the each of the sensors.

In one embodiment of the invention, the image sensor comprises a CMOS image sensor.

In one embodiment of the invention, the sensors comprise photo sensors.

In one embodiment of the invention, the material of the first via walls and/or a material of the second via walls comprise a non-transparent material.

In one embodiment of the invention, the material of the first via walls and/or a material of the second via walls comprise a reflective material. In another embodiment of the invention, the reflective material comprises a metal. In another embodiment of the invention, the metal comprises aluminum or copper.

Accordingly, in the present invention, since the non-transparent or reflective via walls are provided for preventing the light leakage between neighboring pixels, the problem of light leakage and crosstalk of the image sensor is solved. Therefore, the spatial resolution and the photo sensitivity of the image sensor are also enhanced. It is noted that, the image sensor of the invention may comprises one, two or more IMD layers, and the via walls may be disposed in any one or two or more IMD layers. The material of the via walls may be the same or different from the metal layers in the IMD. If the material of the via walls are identical to the metal layers, the via walls and the metal layers may be manufactured simultaneously. Therefore, the cost and the process time are not significantly increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
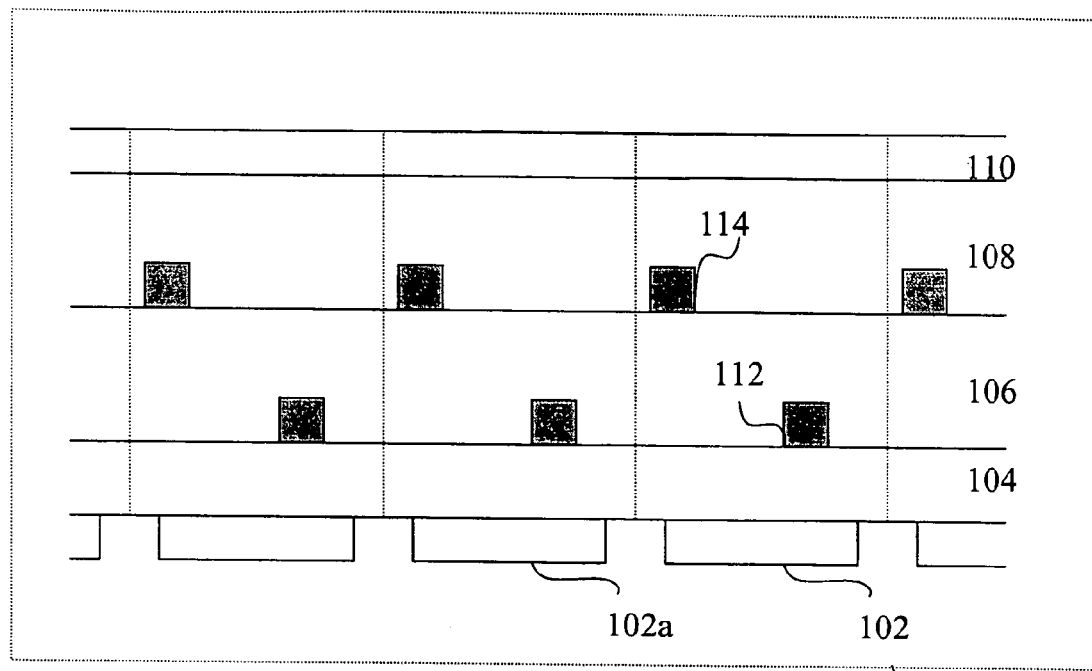
FIG. 1 is a cross-sectional view schematically illustrating a conventional image sensor device.
Figure 2:
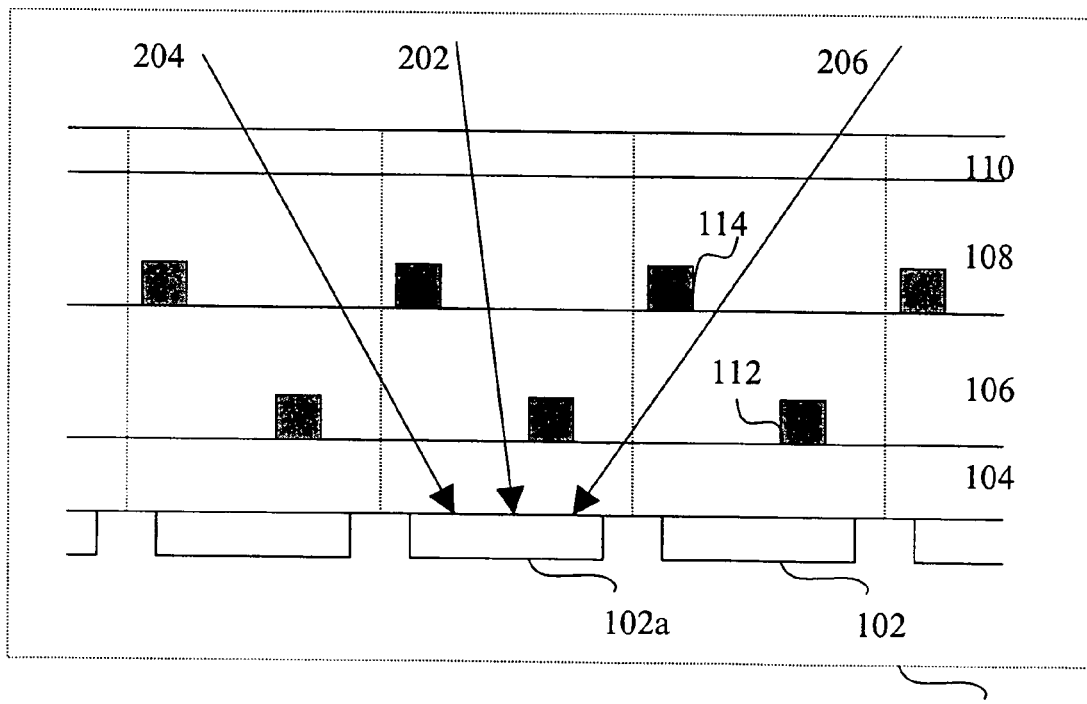
FIG. 2 schematically illustrates the crosstalk of the image sensor device shown in FIG. 1.
Figure 3:
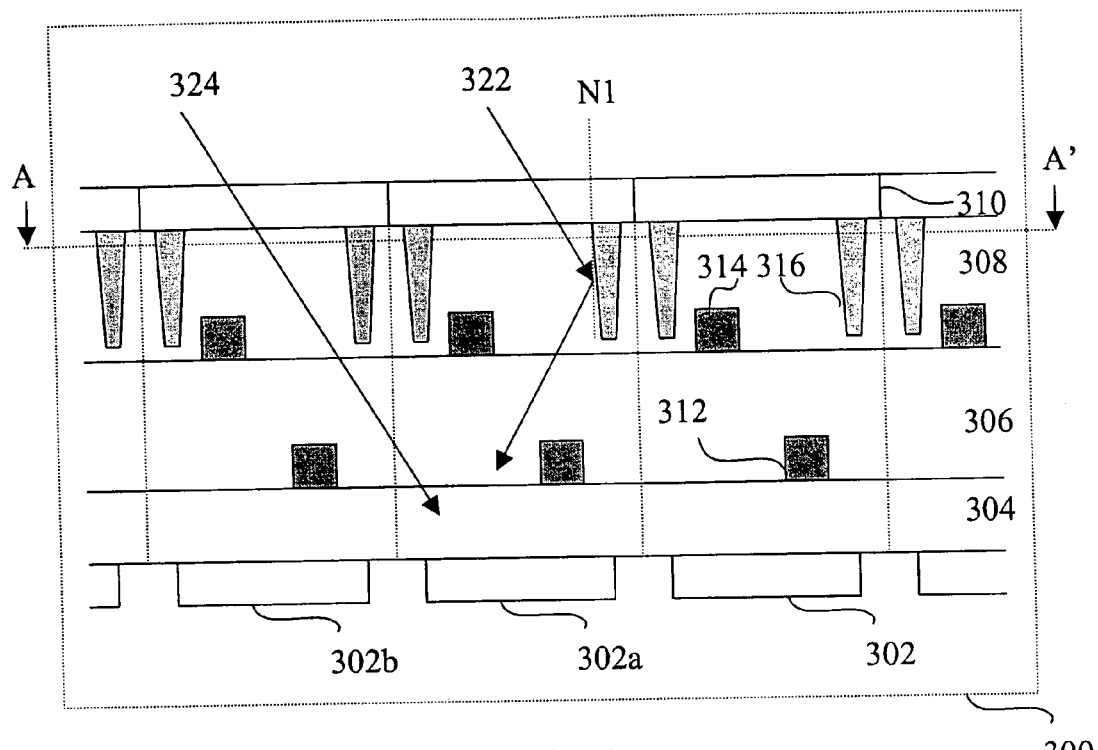
FIG. 3 is a cross-sectional views schematically illustrating an image sensor according to an embodiment of the present invention.

FIG. 3 is a cross-sectional view schematically illustrating an image sensor according to an embodiment of the present invention. Referring to FIG. 3, an image sensor 300 comprises, for example but not limited to, a plurality of sensors 302, an inter-layer dielectric (ILD) layer 304, inter-metal dielectric (IMD) layers 306 and 308 having a plurality of metal 1 (MI) layers 312 and metal 2 (M2) layers 314 respectively, a plurality of cover layers 310 and a plurality of second via walls 316. The image sensor 300 comprises, for example but not limited to, a CMOS image sensor. It is noted that, in another embodiment of the invention, the IMD layers may be one or more than two, and the via layers may be disposed in any IMD layers. The cover layer 310 comprises, for example but not limited to, color filters for color filtration and protection. The sensors 302 comprises, for example but not limited to, a photo sensor.

Referring to FIG. 3, the second via walls 316 may be formed when the M2 layers 314 is formed, and thus the second via walls 316 and the M2 layers 314 may be patterned simultaneously by using the same mask. In another embodiment of the invention, the material of the second via walls 316 comprises, for example but not limited to, non-transparent materials or reflective materials such as aluminum or copper. In addition, the material of the second via walls 316 and the material of the M2 layers 314 may be the same. Therefore, when the second via walls 316 is manufactured, it is not necessary to add any external step to manufacture the image sensor. Thus the cost and the process time are not significantly increased.

Hereinafter, the function of the invention for preventing the light leakage between the neighboring pixels of the image sensor will be described. Referring to FIG. 3, for example, for sensor 302a, when the second via wall 316 is non-transparent, the light 322 will not leak out of the sensor 302a. In addition, if the second via wall is composed of reflective material, the light 322 will be totally reflected regardless of the angle between the light 322 and the normal line N1. However, it is noted that, for example, for sensor 302b, the incident light 324 may be received by the sensor 302a. Accordingly, another embodiment of the invention has been developed.

Figure 4:
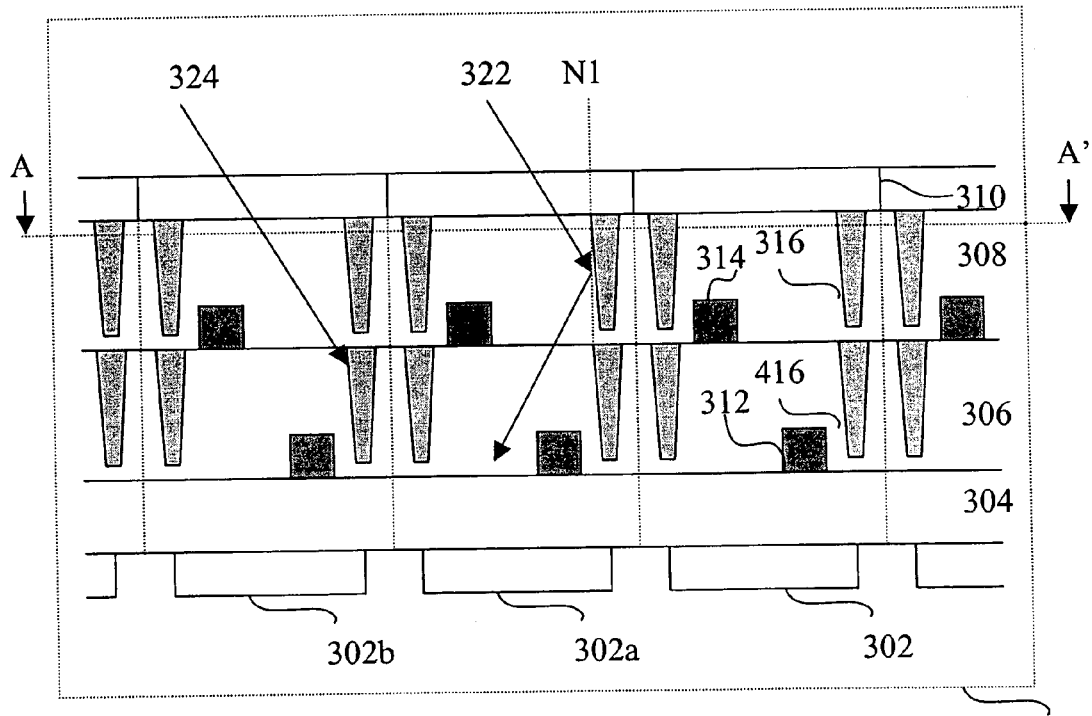
FIG. 4 is a cross-sectional views schematically illustrating an image sensor according to another embodiment of the present invention.

FIG. 4 is a cross-sectional view schematically illustrating an image sensor according to another embodiment of the present invention. In comparison with FIG. 3, the CMOS image sensor 400 of FIG. 4 further comprises, for example but not limited to, a plurality of first via walls 416 except for the CMOS image sensor 300 of FIG. 3. It is noted that, in another embodiment of the invention, the IMD layers may be more than two, and the via layers may be disposed in any two or more IMD layers. The components of FIG. 4 having the same reference numbers of FIG. 3 may be identical or similar thereof. Referring to FIG. 4, it is noted that the light 324 in FIG. 3 is totally reflected by the first via wall 416 and will not be received by the sensor 302a. The first via walls 416 may be formed when the MI layers 312 is formed, and thus the first via walls 416 and the M1 layers 312 may be patterned simultaneously by the same mask. In another embodiment of the invention, the material of the first via walls 416 comprises, for example but not limited to, a non-transparent material or a reflective material such as aluminum or copper. In addition, the material of the first via walls 416 and the material of the Ml layers 312 may be the same.

Figure 5:
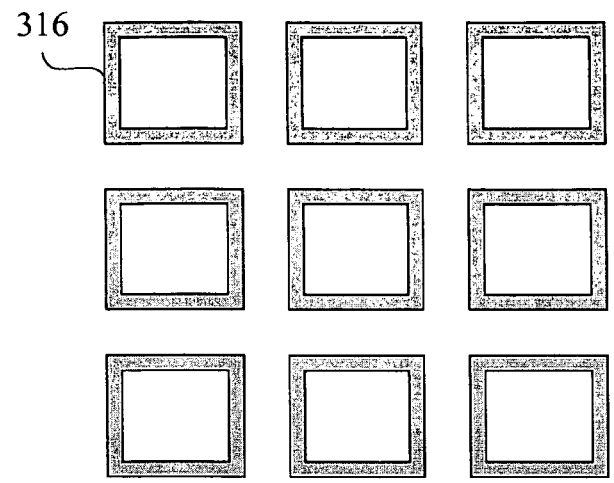
FIG. 5 is top view along the cross-sectional line AA' of FIG. 3 or FIG. 4.

FIG. 5 is top view along the cross-sectional line AA' of FIG. 3 or FIG. 4. Referring to FIG. 5, the image sensor 300 or 400 is divided into a plurality of pixel areas by the second via walls 316 (in FIG. 3) or via 2 and first via walls 316 and 416 (in FIG. 4). In FIG. 5, each pixel area is surrounded by one via wall 316 and includes one sensor 302. Therefore, the light leakage between neighboring pixels are solved, thus the problem of crosstalk is solved. In addition, the spatial resolution and the photo sensitivity are enhanced.

Figure 6:
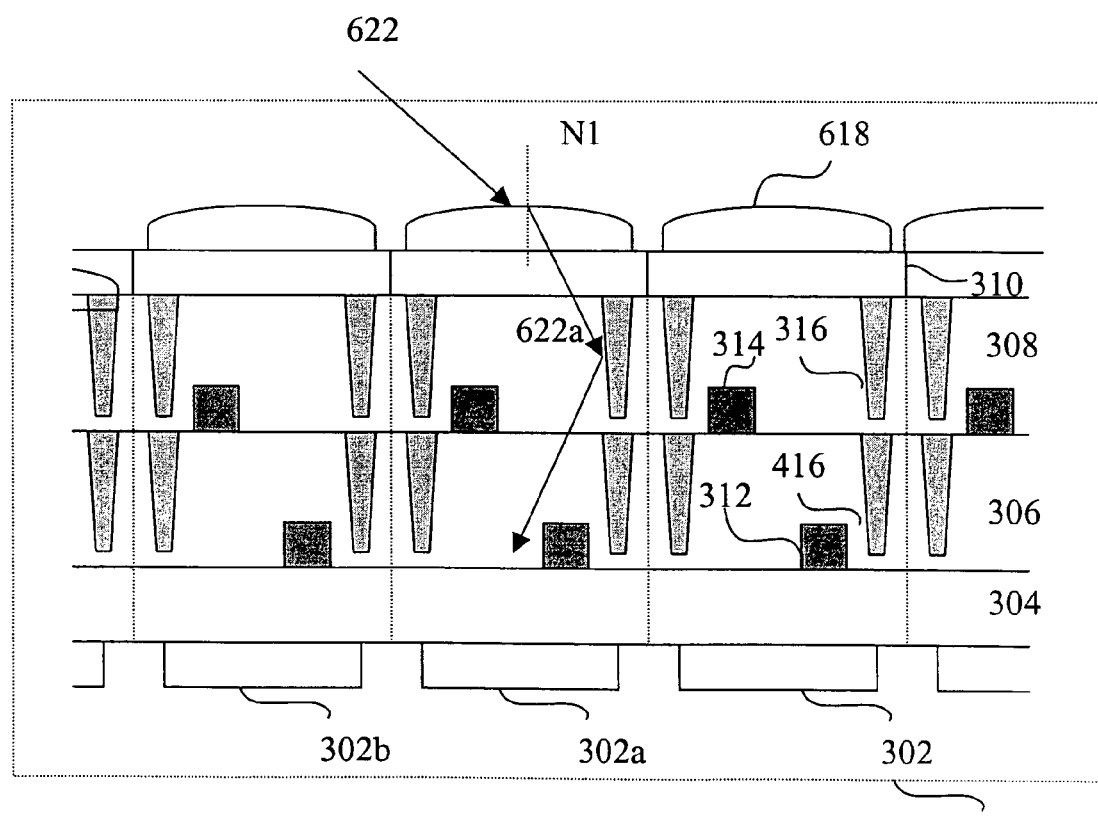
FIG. 6 is cross-sectional view schematically illustrating an image sensor according to one embodiment of the invention.

FIG. 6 is cross-sectional view schematically illustrating an image sensor according to one embodiment of the invention. In comparison with FIG. 6, the CMOS image sensor 600 of FIG. 4 further comprises, for example but not limited to, a plurality of micro lens 618 except for the CMOS image sensor 400 of FIG. 4. The components of FIG. 6 having the same reference numbers of FIG. 4 may be identical or similar thereof. Referring to FIG. 6, it is noted that after the refraction of the micro lens 618, the angle between the refracted light 622a and the normal line N1 is smaller than the angle between the light 622 and the normal line N1 since the refraction index of the micro lens 618 is larger than that of the IMD 308. Therefore, the influence of the incident light with a large incident angle is smaller than the influence in the embodiments shown in FIG. 3 or FIG. 4. It is noted that the micro lens may also be disposed in the image sensor shown in FIG. 3.

Accordingly, in the present invention, since the non-transparent or reflective via walls are provided for preventing the light leakage between neighboring pixels, the problem of light leakage and crosstalk of the image sensor is solved. Therefore, the spatial resolution and the photo sensitivity of the image sensor are also enhanced. It is noted that, the image sensor of the invention may comprises one, two or more IMD layers, and the via walls may be disposed in any one or two or more IMD layers. The material of the via walls may be the same or different from the metal layers in the IMD. If the material of the via walls are identical to the metal layers, the via walls and the metal layers may be manufactured simultaneously. Therefore, the cost and the process time are not increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an image sensor, comprising:
    providing a plurality of sensors;
    forming an inter-layer dielectric layer over the sensors;
    forming a first inter-metal dielectric layer over the inter-layer dielectric layer;
    forming a plurality of first metal layers in the first inter-metal dielectric layer;
    forming a plurality of first via walls only in the first inter-metal dielectric layer, wherein each of the first via walls is solid in structure and non-transparent for all incident angles and disposed around each of the sensors and a bottom surface of the first via walls is substantially lower than a top surface of the first metal layers;
    forming a second inter-metal dielectric layer over the first inter-metal dielectric layer; and
    forming a plurality of second via walls only in the second inter-metal dielectric layer, wherein each of the second via walls is solid in structure and non-transparent for all incident angles.

2. The method of claim 1, wherein the first via walls and the first metal layers are formed at the same time.

3. The method of claim 1, further comprising:
    forming a plurality of second metal layers in the second inter-metal dielectric layer.

4. The method of claim 3, wherein the second via walls and the second metal layers are formed at the same time.

5. The method of claim 1, further comprising:
    forming a cover layer over the inter-metal dielectric layer.

6. The method of claim 5, wherein the cover layer comprises a plurality of color filters, wherein each of the color filter is formed over each of the sensors.

7. The method of claim 5, further comprising:
    forming a plurality of micro lens over the cover layer, wherein each of the micro lenses is formed over the each of the sensors.

8. The method of claim 1, wherein the image sensor comprises a CMOS image sensor.

9. The method of claim 1, wherein the sensors comprise photo sensors.

10. The method of claim 1, wherein a material of the first via walls and/or a material of the second via walls comprise a reflective material.

11. The method of claim 10, wherein the reflective material comprises metal.

12. The method of claim 1, wherein the metal comprises aluminum or copper.

13. A method of manufacturing an image sensor, comprising:
    providing a plurality of sensors, wherein each of the sensors is formed in a pixel area;
    forming an inter-layer dielectric layer over the sensors;
    forming a first inter-metal dielectric layer over the inter-layer dielectric layer;
    forming a plurality of first metal layers in the first inter-metal dielectric layer; and
    forming a plurality of first via walls only in the first inter-metal dielectric layer, wherein each of the first via walls is solid in structure and non-transparent for all incident angles and a bottom surface of the first via walls is substantially lower than a top surface of the first metal layers.

* * * * *